(12) United States Patent
Lan

(10) Patent No.: US 7,602,326 B2
(45) Date of Patent: Oct. 13, 2009

(54) DIGITAL-TO-ANALOG CONVERTER HAVING RESISTOR STRING WITH RANGES TO REDUCE CIRCUIT ELEMENTS

(75) Inventor: Shiming Lan, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/046,514

(22) Filed: Mar. 12, 2008

(65) Prior Publication Data

US 2008/0180295 A1 Jul. 31, 2008

Related U.S. Application Data

(63) Continuation-in-part of application No. 11/640,859, filed on Dec. 19, 2006, now Pat. No. 7,365,670.

(30) Foreign Application Priority Data

Jan. 20, 2006 (JP) .............................. 2006-012327

(51) Int. Cl.
*H03M 1/66* (2006.01)
(52) U.S. Cl. ...................................... 341/145; 341/144
(58) Field of Classification Search .......... 341/144–170

See application file for complete search history.

(56) References Cited

U.S. PATENT DOCUMENTS

| 5,093,661 | A  | * | 3/1992  | Tanimoto ..................... 341/144 |
| 6,480,132 | B1 | * | 11/2002 | Yoshioka et al. ............ 341/160 |
| 6,556,162 | B2 |   | 4/2003  | Brownlow et al. |
| 6,950,045 | B2 | * | 9/2005  | Kim ........................... 341/144 |
| 7,183,962 | B1 | * | 2/2007  | Roo et al. ................... 341/161 |

FOREIGN PATENT DOCUMENTS

JP 2002026732 1/2002

* cited by examiner

*Primary Examiner*—Lam T Mai
(74) *Attorney, Agent, or Firm*—Volentine & Whitt, P.L.L.C.

(57) ABSTRACT

An analog-to-digital converter has a resistor string that generates a series of voltages. An upper selector selects voltages at the upper end of the series. A lower selector selects voltages at the lower end of the series. A pair of midrange selectors select a pair of adjacent voltages in the middle range of the series. A midrange voltage generator generates further voltages spaced between the two selected midrange voltages. An output selector selects one of the further voltages. The selectors are controlled by various bits of a digital input signal. The voltage selected by the upper selector, lower selector, or output selector becomes an analog output signal. This analog-to-digital converter has comparatively few resistors and transistors and can generate accurate voltages for driving a grayscale display.

16 Claims, 5 Drawing Sheets

DIGITAL-TO-ANALOG CONVERTER HAVING RESISTOR STRING WITH RANGES TO REDUCE CIRCUIT ELEMENTS

CROSS-REFERENCE TO RELATED APPLICATIONS

This application is a continuation-in-part of application Ser. No. 11/640,859, filed on Dec. 19, 2006, now U.S. Pat. No. 7,365,670, which is hereby incorporated for all purposes.

BACKGROUND OF THE INVENTION

1. Field of the Invention

The present invention relates to a digital-to-analog converter (DAC) that generates voltages useful for driving, for example, a liquid crystal to produce a vivid display.

2. Description of the Related Art

Referring to FIG. 1, a conventional DAC of the type used in a liquid crystal driving circuit to convert a six-bit digital signal to an analog voltage signal with sixty-four levels comprises a resistor string that divides a reference voltage and outputs sixty-four different voltages, and a switching circuit that selects one of the sixty-four voltages according to the value of the digital input signal.

The resistor string is a string of sixty-three resistors (R1 to R63) connected in series between a lower reference voltage VRL and an upper reference voltage VRH to form a voltage divider. Voltages V0 (=VRL), V1, V2, ..., V63 (=VRH) at sixty-four different levels are output from the two ends and sixty-two interconnection nodes of the resistor string.

The switching circuit is a six-stage binary tree selection circuit controlled by six bits $b_0$ to $b_5$. Pairs of adjacent voltages V0 and V1, V2 and V3, ..., V62 and V63 are connected to first-stage switches $SW0_1$, $SW0_2$, ..., $SW0_{32}$ and one voltage in each pair is selected according to the value of the least significant bit $b_0$; the outputs of pairs of adjacent first-stage switches $SW0_1$ and $SW0_2$, $SW0_3$ and $SW0_4$, ... are connected to second-stage switches $SW1_1$, $SW1_2$, ..., and one voltage from each of these pairs is selected according to the value of bit $b_1$. Similar selections are made in sequence by third-stage switches $SW2_1$, $SW2_2$, ... according to the value of bit $b_2$, fourth-stage switches $SW3_1$, $SW3_2$, ... according to the value of bit $b_3$, and fifth-stage switches $SW4_1$, $SW4_2$, ... according to the value of bit $b_4$, and finally a single analog voltage corresponding to the value of the input digital input signal is selected and output as the output voltage OUT from switch SW5 according to the value of the most significant bit $b_5$.

Japanese Patent Application Publication No. 2002-26732 discloses a k-bit two-stage nonlinear DAC having a first converter that converts the m highest bits to analog voltages, a pre-charging circuit that precharges an output load according to a selected one of these analog voltages, and a second converter that converts the n lowest bits to another analog voltage (m+n=k). This configuration is used to provide increased conversion speed for an active-matrix liquid crystal display.

A problem with the conventional DACs described above is that the number of resistors in the resistor string and the number of switches needed to select the divided voltages increase exponentially. This is a particular problem nowadays, because the increasing size of liquid crystal displays demands a gray scale with more levels for a more vivid color display. This requires an increased number of digital input signal bits, exponentially increasing the area occupied by the resistor string and switches in the DAC.

Another problem is posed by the large number of signal lines or 'channels' that are driven through separate switching circuits from a single resistor string. When the displayed image has a large area of a single color or gray level, hundreds of channels may be connected simultaneously to the same node in the resistor string. In such cases, the combined effect of parasitic wiring resistance or parasitic circuit elements concentrated at a single point in the resistor string can significantly distort the output voltages.

In the two-stage nonlinear DAC described above, accuracy is a particular problem near the upper and lower reference voltage levels, where the gray scale is nonlinear and the voltage differences between adjacent gray levels gradually increase, demanding a gamma correction that the second-stage converter cannot provide.

SUMMARY OF THE INVENTION

An object of the present invention is to provide a DAC of the resistor string type that can provide an increased number of output levels with more consistent accuracy while occupying a decreased amount of space.

A DAC according to the present invention has a first resistor string for generating a series of voltages spanning an upper range, a lower range, and a midrange disposed between the upper range and the lower range.

A lower selector selects one of the voltages in the lower range of the series as the analog output voltage when the digital input signal has a value equal to or less than a first boundary value.

An upper selector selects one of the voltages in the upper range of the series as the analog output voltage when the digital input signal has a value equal to or greater than a second boundary value.

A pair of midrange selectors select a mutually adjacent pair of voltages in the midrange of the series when the digital input signal has a value between the first and second boundary values.

A midrange voltage generator generates a further series of voltages between the pair of voltages selected by the midrange selectors. The midrange voltage generator may be a second resistor string.

An output selector selects one of the voltages in the further series as the analog output voltage when the digital input signal has a value strictly between the first and second boundary values.

The above structure significantly reduces the number of circuit elements required to generate and select midrange voltages, and the number of circuit elements needed to select voltages in the upper and lower ranges. Accuracy is improved because of reduced parasitic loads. Gamma corrections can be carried out accurately by confining the midrange to the linear part of the of the gamma curve.

DETAILED DESCRIPTION OF THE INVENTION

Figure 1:
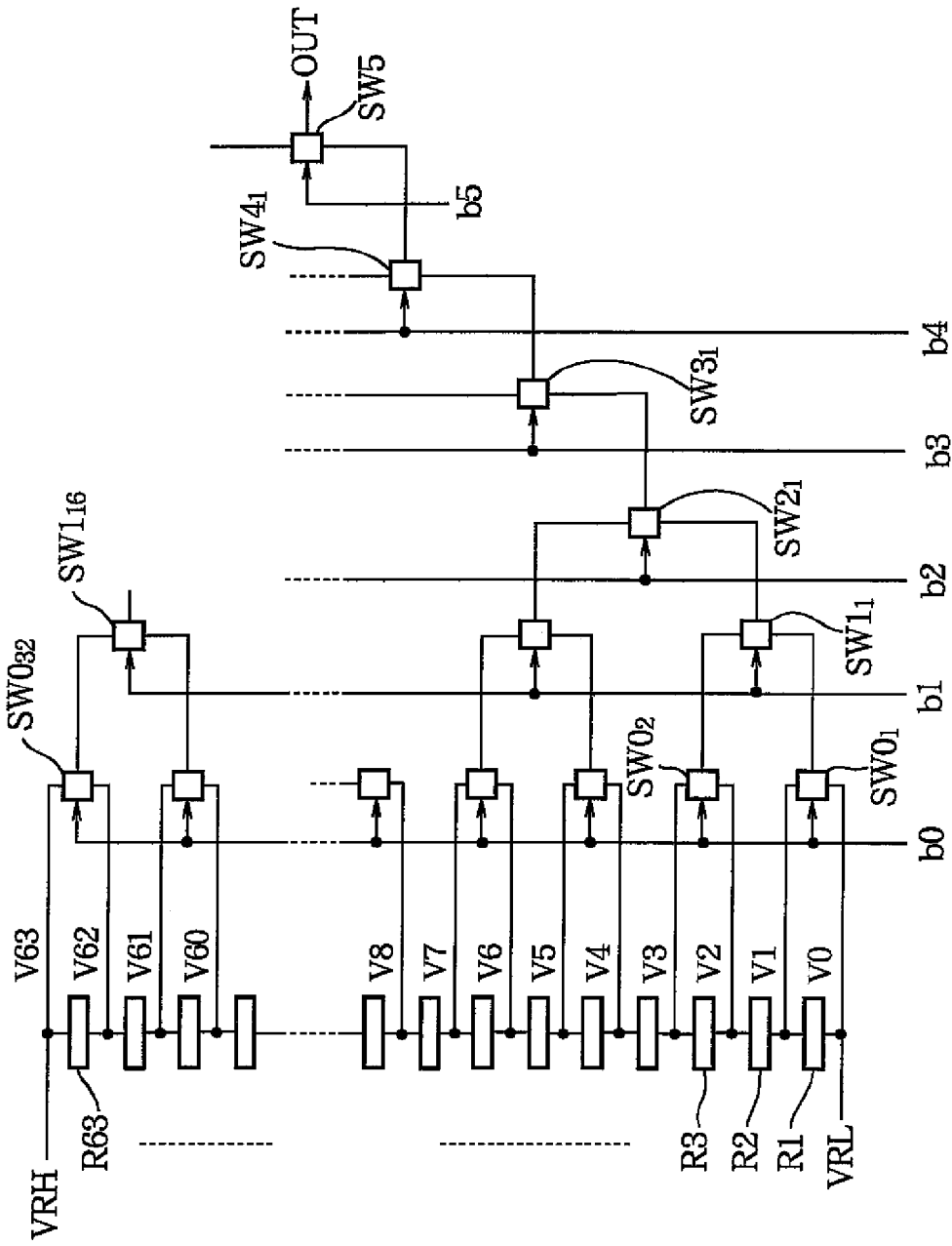
FIG. 1 is a circuit diagram of a conventional DAC.

A DAC embodying the present invention will now be described with reference to the attached drawings, in which like elements are indicated by like reference characters. For simplicity, parentheses are omitted in the drawing: for example, $V(2^n-1)$ is shown in the drawings as V$2^n$–1.

Figure 2:
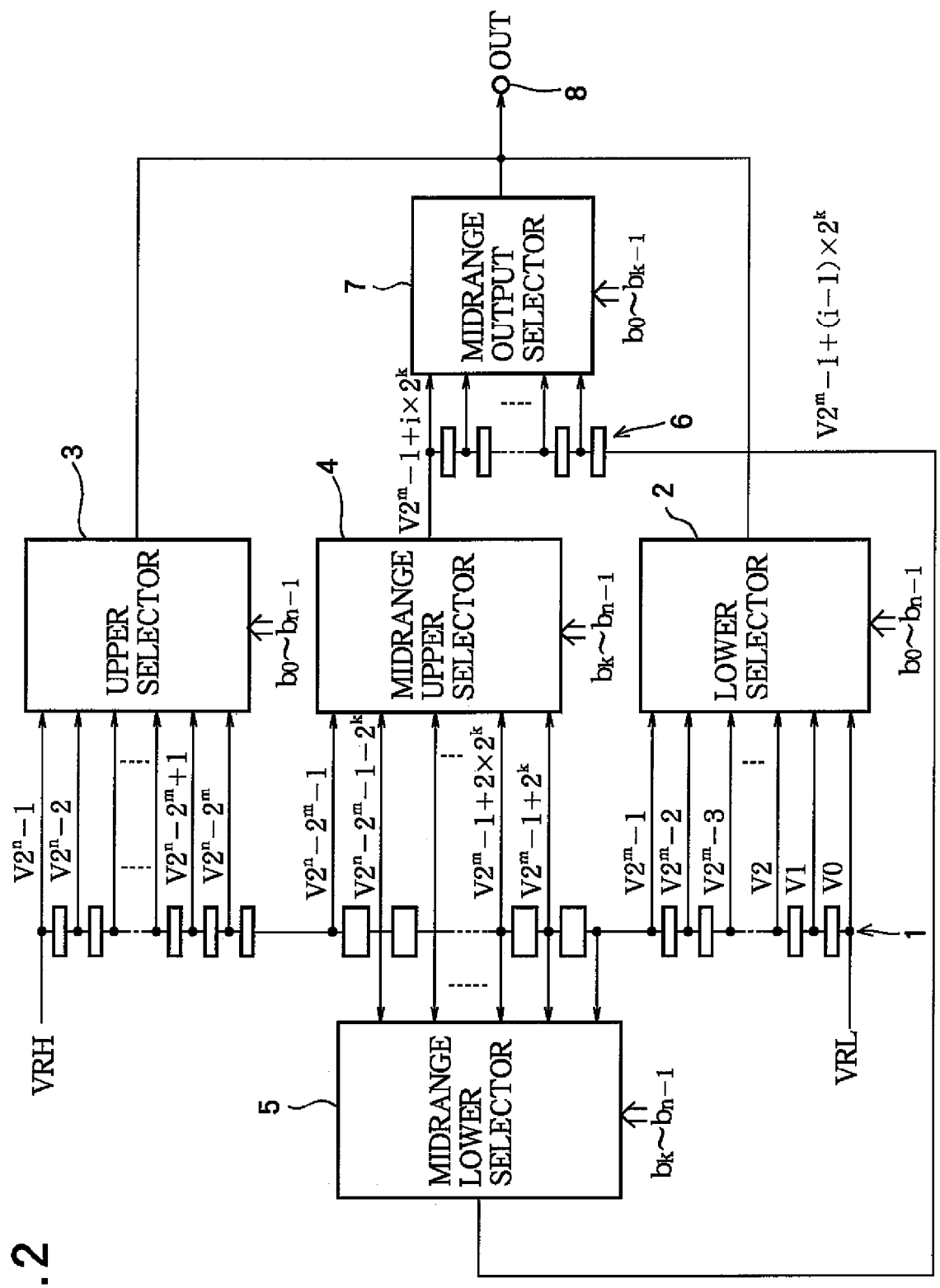
FIG. 2 is a block diagram illustrating the general structure of a DAC according to the present invention.

Referring to FIG. 2, the DAC converts an n-bit digital input signal taking values from 0 to $2^n-1$ to an analog output voltage taking values from VRL to VRH. The parameter n is a positive integer, and VRH and VRL are externally supplied analog reference voltages. The analog output voltage, also referred to below as a driving voltage or gray scale voltage, can be used to drive a picture element in a display device. The DAC comprises a resistor string 1 consisting of a plurality of resistors connected in series between the lower reference voltage VRL and the upper reference voltage VRH to function as a voltage divider; a lower selector 2, an upper selector 3, a midrange upper selector 4, and a midrange lower selector 5 that select voltages output from resistor string 1; a midrange resistor string 6; and a midrange output selector 7 that selects voltages output from the midrange resistor string 6.

At the lower (VRL) end of the resistor string 1, a series of $2^m-1$ resistors with values corresponding to differences between adjacent gray levels generate gray scale voltages V1, V2, ..., $V(2^m-1)$. These voltages and reference voltage VRL, also denoted V0, constitute the lower range of gray scale voltages. The letter 'm' designates a positive integer less than n, and is equal to the number of switching stages in the lower selector 2 and upper selector 3.

At the upper (VRH) end of resistor string 1, a series of $2^m$ resistors with values corresponding to differences between adjacent gray levels generate gray scale voltages $V(2^n-2)$, $V(2^n-3)$, ..., $V(2^n-2^m)$, $V(2^n-2^m-1)$. Reference voltage VRH, also denoted $V(2^n-1)$, and voltages $V(2^n-2)$, $V(2^n-3)$, ..., $V(2^n-2^m)$ constitute the upper range of gray scale voltages.

In the middle part of resistor string 1, a series of resistors with values corresponding to $2^k$ gray scale levels (k is equal to or greater than 2 and less than m) generate gray scale voltages $V(2^m-1+2^k)$, $V[2^m-1+(2\times2^k)]$, ..., $V(2^n-2^m-1-2^k)$, $V(2^n-2^m-1)$, which occupy the midrange. Voltage $V(2^m-1)$ is also used as part of the midrange, so the midrange and the lower range overlap at this voltage. The boundary values of the digital input signal that define the midrange are $2^m-1$ and $2^n-2^m$.

The voltages V0, V1, V2, ..., $V(2^m-1)$ in the lower range are supplied to the lower selector 2, and the voltages $V(2^n-1)$, $V(2^n-2)$, ..., $V(2^n-2^m)$ in the upper range are supplied to the upper selector 3. Midrange voltages $V(2^m-1+2^k)$, $V[2^m-1+(2\times2^k)]$, ..., $V(2^n-2^m-1)$ are supplied to the midrange upper selector 4: midrange voltages $V(2^m-1)$, $V(2^m-1+2^k)$, ..., $V(2^n-2^m-1-2^k)$ are supplied to the midrange lower selector 5.

The lower selector 2 comprises a group of switches connected in a binary tree configuration to select a gray scale voltage responsive to bits $b_0$ to $b_m$ of the digital input signal when bits $b_{m+1}$ to $b_{n-1}$ are all zero ('0'). The highest voltage that can be selected and output by the lower selector 2 is $V(2^m-1)$. When the digital input signal has a value of $2^m$ or higher, the output of the lower selector 2 is in the high-impedance state, i.e., is switched off; in effect, the lower selector 2 does not operate.

Similarly, the upper selector 3 comprises a group of switches connected in a binary tree configuration to select a corresponding gray scale voltage responsive to bits $b_0$ to $b_m$ of the digital input signal when bits $b_{m+1}$ to $b_{n-1}$ are all one ('1'). The lowest gray scale voltage that can be selected and output by the upper selector 3 is $V(2^n-2^m)$. When the digital input signal has a value lower than $2^n-2^m$, the output of the upper selector 3 is switched off.

The midrange upper selector 4 comprises a group of switches connected in a binary tree configuration to select gray scale voltages responsive to bits $b_k$ to $b_{n-1}$ in the digital input signal. The selected voltages correspond to gray levels at which bits $b_0$ to $b_{k-1}$ in the digital input signal are all one ('1'). The midrange upper selector 4 can select and output gray scale voltages from $V(2^m-1+2^k)$ to $V(2^n-2^m-1)$ at steps of $2^k$ gray levels.

The midrange lower selector 5 comprises a group of switches connected in a binary tree configuration to select gray scale voltages responsive to bits $b_k$ to $b_{n-1}$ in the digital input signal. The midrange lower selector 5 selects a voltage one resistor step lower, or $2^k$ gray levels lower, than the voltage selected by the midrange upper selector 4. Together, the midrange upper selector 4 and midrange lower selector 5 select and output a pair of gray scale voltages $V[2^m-1+(i\times2^k)]$ and $V\{2^m-1+[(i-1)\times2^k]\}$ (where i ranges from 1 to $2^{n-k}-2^{m+1-k}$) responsive to the values of bits $b_k$ to $b_{n-1}$ in the digital input signal.

The outputs of the midrange selectors 4 and 5 are connected to the two ends of a midrange resistor string 6 consisting of $2^k$ resistors with identical resistance values connected in series. When the outputs of the midrange selectors 4 and 5 are switched on, accordingly, the midrange resistor string 6 is connected in parallel with one of the resistors of resistor string 1. The total resistance of the midrange resistor string 6 should be considerably greater (e.g., 1000 times greater) than the resistance of any one resistor in resistor string 1, so as to reduce errors due to resistance variations when the midrange resistor string 6 is switched in and out.

The ($2^k-1$) interconnection nodes in the midrange resistor string 6 and the output of the midrange upper selector 4 are connected to the input side of a midrange output selector 7. The midrange output selector 7 comprises a group of switches connected in a binary tree configuration to select one of the voltages output by the midrange resistor string 6, responsive to bits $b_0$ to $b_{k-1}$ in the digital input signal, and output the selected voltage.

When the digital input signal has a value lower than $2^m$ or higher than $2^n-2^m-1$, the outputs of the three midrange selectors 4, 5, and 7 are in the high-impedance state.

The output terminals of the lower selector 2, upper selector 3, and midrange output selector 7 are connected to an output terminal 8, from which a gray scale voltage selected by the selectors 2 to 5 and selector 7 responsive to the digital input signal is output as an analog output voltage OUT.

Figure 3:
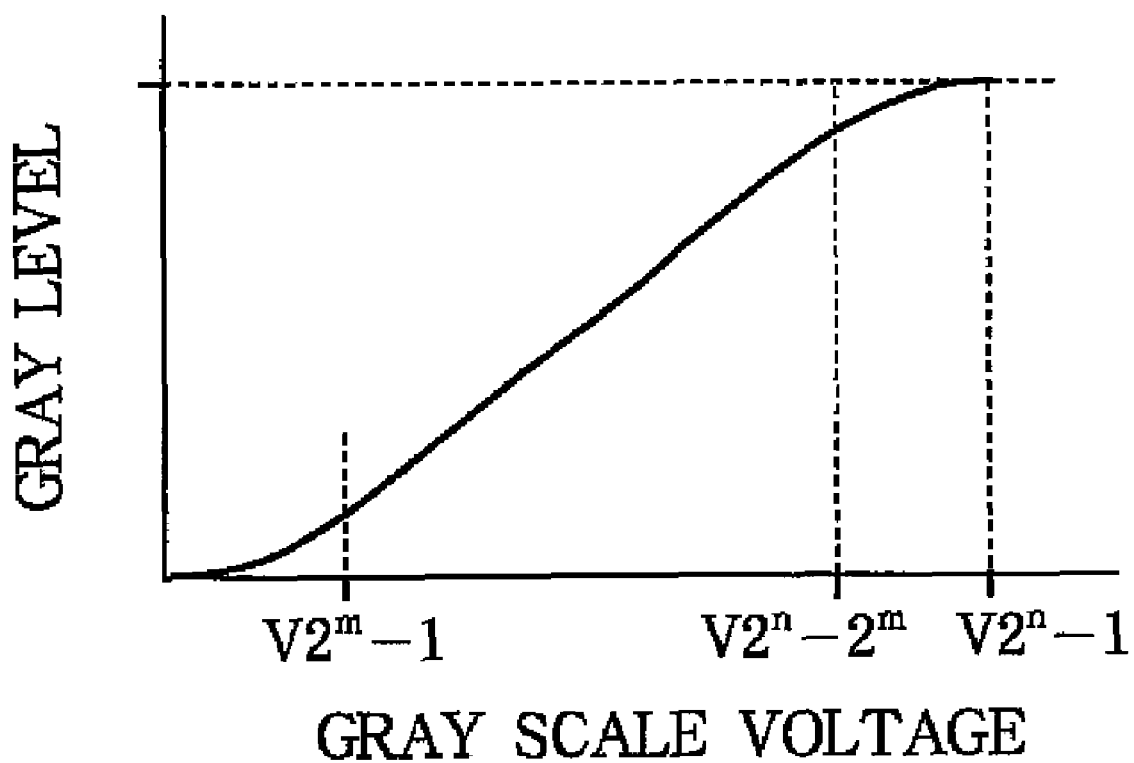
FIG. 3 is a graph representing a relationship between display driving voltages and brightness in a liquid crystal display.

The relation between gray scale voltage or driving voltage and gray level or brightness follows the S-shaped gamma curve shown in FIG. 3. Near the upper and lower ends of the gray scale, above $V(2^n-2^m)$ and below $V(2^m-1)$, brightness changes gradually more slowly and thus increases nonlinearly with respect to the driving voltage, but in the middle region, between $V(2^n-2^m)$ and $V(2^m-1)$, brightness may increase (and in this case does increase) linearly.

If the brightness levels in the gray scale are equally spaced, the voltage difference between adjacent gray levels is not constant, being larger at the upper and lower ends of the gray scale than in the middle. Accordingly, when all gray scale voltages are generated by a single resistor string as in FIG. 1, the resistance values of the resistors in the middle of the string are comparatively small and substantially equal, while the resistance values of the resistors at the upper and lower ends are larger and vary from resistor to resistor.

In FIG. 2, the lower selector 2 and upper selector 3 select gray scale voltages in the regions where there is a nonlinear relationship between gray scale voltage and brightness. In the region where the midrange selectors 4, 5, 7 select the gray scale voltage, there is a linear relationship between voltage and brightness. The resistance values of the $2^m-1$ resistors at the VRL end of resistor string 1 and the $2^m$ resistors at the VRH end are therefore set according to the nonlinear parts of the curve in FIG. 3 to produce different voltage drops equal to the individual differences between adjacent gray scale voltage levels. The resistance values of the $2^k$ gray scale level resistors in the middle section of resistor string 1 are set to equal values corresponding to $2^k$ levels in the linear part of the gray scale.

The operation of the DAC shown in FIG. 2 will now be described.

When the value of the digital input signal falls within the range from 0 to $2^m-1$, the outputs of the upper selector 3 and midrange selectors 4, 5, 7 are in the high-impedance state. The lower selector 2 selects one of the voltages from V0 to $V(2^m-1)$ generated by resistor string 1, corresponding to the value of the digital input signal, and outputs the selected voltage at the output terminal 8 as the analog output voltage OUT.

When the value of the digital input signal falls within the range from $2^n-2^m$ to $2^n-1$, the outputs of the lower selector 2 and midrange selectors 4, 5, 7 are in the high-impedance state. The upper selector 3 selects one of the voltages from $V(2^n-2^m)$ to $V(2^n-1)$ generated by resistor string 1, corresponding to the value of the digital input signal, and outputs the selected voltage at the output terminal 8 as the analog output voltage OUT.

When the value of the supplied digital input signal falls within the range from $2^m$ to $2^n-2^m-1$, the outputs of the lower selector 2 and upper selector 3 are in the high-impedance state. The midrange upper selector 4 selects a voltage $V[2^m-1+(i\times 2^k)]$ for output to the upper end of the midrange resistor string 6. The midrange lower selector 5 selects a gray scale voltage $V\{2^m-1+[(i-1)\times 2^k]\}$, $2^k$ levels lower than the voltage selected by the midrange upper selector 4 in the gray scale, for output to the lower end of the midrange resistor string 6. These two voltages are selected according to the most significant n–k bits of the digital input signal and correspond to signal values in which the least significant k bits are all one ('1'). The midrange output selector 7 selects a voltage from among the $2^k$ equally spaced voltages generated by the midrange resistor string 6, these voltages ranging from $V\{2^m+[(i-1)\times 2^k]\}$ to $V[2^m-1+(i\times 2^k)]$ at intervals corresponding to one gray level and being selected according to the least significant k bits of the digital input signal, and outputs the selected voltage at the output terminal 8 as the analog output voltage OUT.

Figure 4:
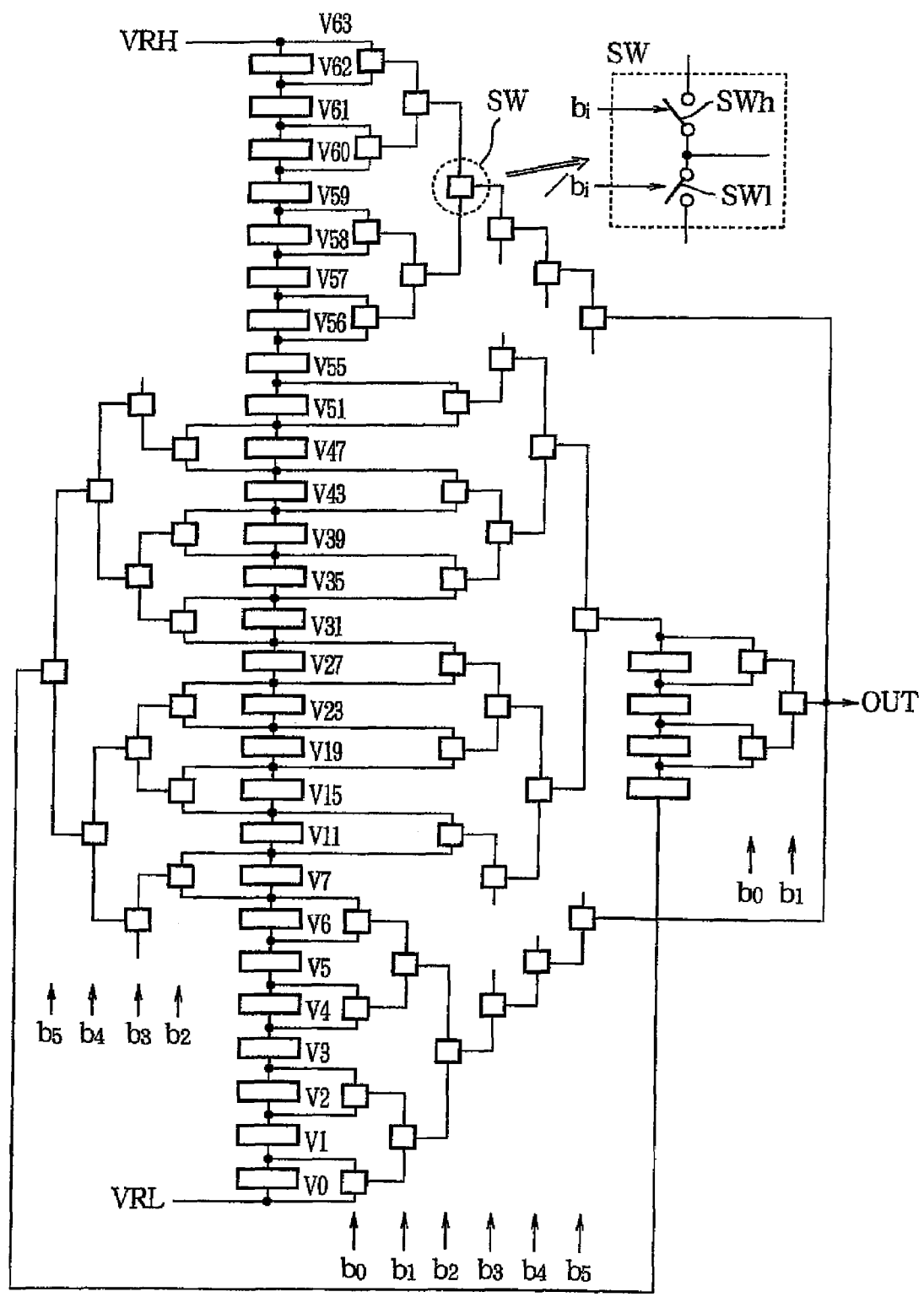
FIG. 4 is a circuit diagram showing a specific embodiment of the DAC in FIG. 2.

FIG. 4 is an illustrative embodiment of the DAC in FIG. 2, showing the structure of the groups of switches in the selectors 2 to 5 and selector 7 when n is six, m is three, and k is two (m=6, m=3, k=2). Resistors are indicated by rectangles and switches by squares. The enlarged part of FIG. 4 indicates the internal structure of a switch SW controlled by a bit $b_i$ and its inverted value $/b_i$: the upper switching element SWh turns on when bit $b_i$ is one ('1') and $/b_i$ is zero ('0'); the lower switching element SWl turns on when bit $b_i$ is zero ('0') and $/b_i$ is one ('1'). Switch SW operates as a selector switch. Switches shown in FIG. 4 with no upper or lower connection line function as simple on/off switches.

If the number of switching elements in switch SW is two, and the number of switching elements in an on/off switch is one, the total number of switching elements in FIG. 4 is ninety, contrasting to one hundred twenty-six in the conventional DAC shown in FIG. 1. The number of resistors constituting the two resistor strings is thirty-one in FIG. 4 and sixty-three in FIG. 1. These figures indicate that the numbers of switching elements and resistors of the DAC in FIG. 4 are significantly reduced in comparison with the conventional DAC shown in FIG. 1.

Figure 5C:
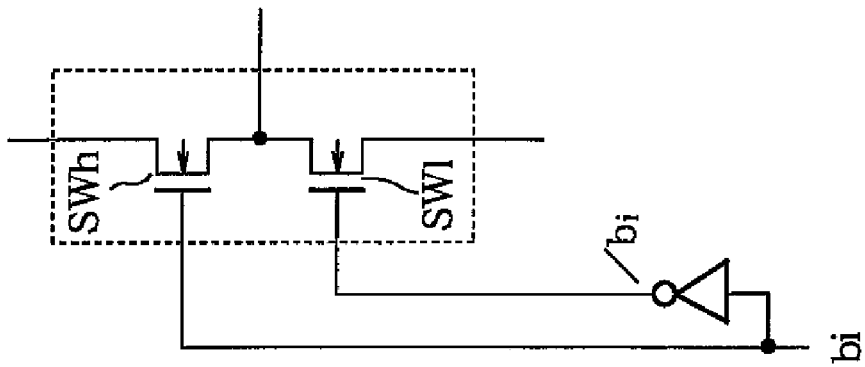
FIGS. 5A, 5B, and 5C are circuit diagrams showing illustrative embodiments of the switches in FIG. 4.
Figure 5B:
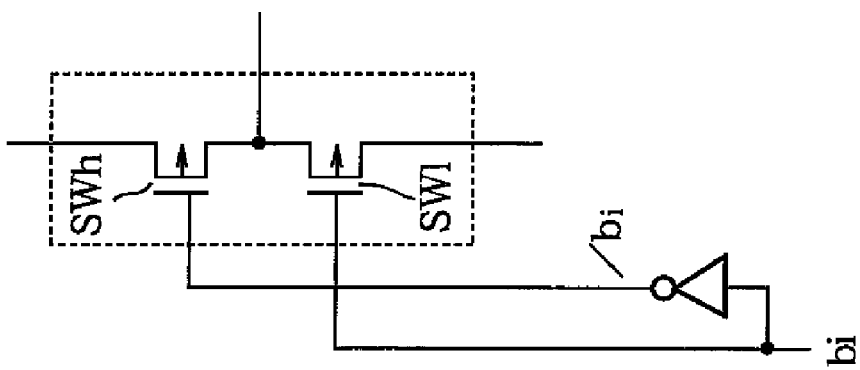
Figure 5A:
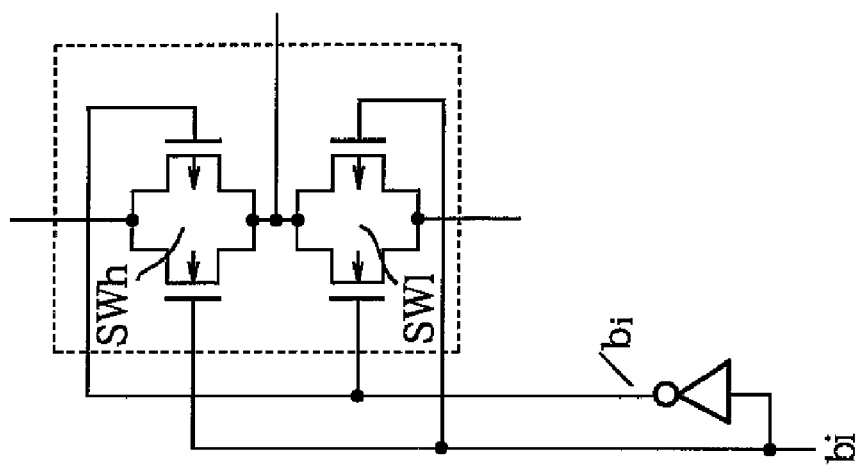

FIGS. 5A to 5C are illustrative embodiments of the switches in FIG. 4.

Switching elements SWh and SWl in FIG. 5A are both n-channel metal-oxide-semiconductor (NMOS) transistors, with their interconnected drains functioning for output and their sources functioning for input. The gate of switching element SWh receives a control signal representing bit $b_i$; the gate of switching element SWl receives the inverted signal $/b_i$. This type of switch can be effectively used when the analog voltages to be switched are not too close to the high logic level of the bit signals $b_i$, $/b_i$.

Switching elements SWh and SWl in FIG. 5B are both p-channel metal-oxide-semiconductor (PMOS) transistors, with their interconnected drains functioning for output and their sources functioning for input. The gate of switching element SWl receives a control signal representing bit $b_i$; the gate of switching element SWh receives the inverted signal $/b_i$. This type of switch can be effectively used when the analog voltages to be switched are not too close to the low logic level of the bit signals $b_i$, $/b_i$.

Switching elements SWh and SWl in FIG. 5C are transmission gates combining PMOS and NMOS transistors. The PMOS transistor of switching element SWh and the NMOS transistor of switching element SWl receive a control signal representing bit $b_i$; the NMOS transistor of switching element SWh and the PMOS transistor of switching element SWl receive the inverted signal $/b_i$. This type of switch provides good switching characteristics for all input voltages.

Depending on the voltage range of the analog output signal and the threshold voltages of the PMOS and NMOS transistors, the configurations in FIGS. 5A, 5B, and 5C can be used in various combinations. One preferable combination, since it minimizes the number of transistors, uses NMOS switching elements as in FIG. 5A in the lower selector 2 and PMOS switching elements as in FIG. 5B in the upper selector 3 and midrange selectors 4, 5, 7. Another preferable combination uses transmission gates as in FIG. 5C in the lower selector 2 and PMOS switching elements as in FIG. 5B in the upper selector 3 and midrange selectors 4, 5, 7. Other potentially useful combinations include NMOS switching elements in the lower and midrange selectors and PMOS switching elements in the upper selectors, NMOS switching elements in the lower and midrange selectors and transmission gates in the upper selectors, and NMOS switching elements in the lower selector, transmission gates in the midrange selectors, and PMOS switching elements in the upper selector.

The switching-element transistors in the lower selector 2 and upper selector 3 may be formed in separate wells to avoid the degradation of switching characteristics caused by back bias.

As described above, the DAC according to this embodiment provides a lower selector 2 and upper selector 3 that select voltages in the nonlinear upper and lower parts of the gray scale simply by decoding the input digital input signal. For the linear middle portion of the gray scale, the DAC provides a pair of midrange selectors 4 and 5 that select two voltages separated by a difference equivalent to $2^k$ gray levels, a midrange resistor string 6 that further divides this voltage difference into $2^k$ levels, and a midrange output selector 7 that selects a corresponding gray scale voltage from the further series of divided voltages. This configuration reduces the number of switching elements needed to select gray levels, thereby reducing parasitic loads, and greatly reduces the number of resistors in resistor string 1.

The embodiment shown in FIG. 4 (in which n=6, m=3, and k=2) does not imply that six-bit DACs are the preferred application of the present invention. The invention is more applicable to DACs in which n is equal to or greater than eight, because the problems of the prior art described earlier begin to appear at about n=8.

In a DAC with eight or more input bits, from considerations of device size and manufacturing variations, the number of resistors used in the lower range and upper range is preferably about 3% of the total number of gray levels. Therefore, m=n−5 is preferable. If this condition is satisfied, the number of levels in the gray scale can be increased while variations in output accuracy are simultaneously reduced.

The values of n, m, and k in FIG. 2 can, however, be set arbitrarily provided the relationship $2 \leq k < m < n$ holds among them. For example, an eight-bit DAC can be configured with k=2, m=5, so that the lower and upper selectors 2 and 3 select voltages for the lower and upper thirty-two gray levels, respectively, and the midrange upper selector 4 and midrange lower selector 5 select forty-eight midrange voltages each at intervals of four gray levels.

An exemplary eight-bit DAC designed according to the present invention takes up about 40% less space than a conventional eight-bit DAC. As the number of bits to be converted increases, the space saving effect becomes even greater.

The invention is not limited to the embodiment shown in FIG. 2; many other variations are possible, including, for example, the following.

The midrange resistor string 6 may be replaced with a capacitive voltage divider using capacitors.

The condition that k be less than m is not strictly necessary; k may be equal to m, or one greater than m.

More generally, the division into an upper range, a lower range, and a midrange may be made at arbitrary boundary values of the digital input signal. The voltage corresponding to one of the boundary values must be selected by both one of the upper and lower selectors and one of the midrange selectors, but this may be the upper boundary voltage instead of the lower boundary voltage.

In FIG. 2, for example, the midrange lower selector 5 may select voltages from $V2^m$ to $V(2^n-2^m-2^k)$, and the midrange upper selector 4 may select voltages from $V(2^m+2^k)$ to $V(2^n-2^m)$, the selected voltages corresponding to digital input signal values in which the least significant k bits are all zero '0'.

The voltages generated by the first resistor string 1 need not be equally spaced in the midrange and unequally spaced in the upper and lower ranges. The S-shaped curve shown in FIG. 3 can be approximated with equally spaced voltages in the upper and lower ranges, for example, or the voltages may be unequally spaced in all three ranges, still yielding analog output voltages that are spaced farther apart in the upper and lower ranges than in the midrange at the output terminal 8 (OUT). The basic requirement is that the resistance values of the resistors in the upper and lower ranges of the first resistor string 1 should be greater than the resistance values of the resistors in the midrange of the first resistance string 1 divided by the number N of voltages generated by the midrange resistor string 6 (in the above embodiment, $N=2^k$).

Those skilled in the art will recognize that further variations are possible within the scope of the invention, which is defined in the appended claims.

What is claimed is:

1. A digital-to-analog converter for converting a digital input signal to an analog output voltage, comprising:
   a first resistor string for generating a series of voltages spanning an upper range, a lower range, and a midrange disposed between the upper range and the lower range;
   a lower selector for selecting one of the voltages in the lower range as the analog output voltage when the digital input signal has a value equal to or less than a first boundary value;
   an upper selector for selecting one of the voltages in the upper range as the analog output voltage when the digital input signal has a value equal to or greater than a second boundary value;
   a pair of midrange selectors for selecting a mutually adjacent pair of voltages in the midrange when the digital input signal has a value between the first and second boundary values;
   a midrange voltage generator for generating a further series of voltages between the pair of voltages selected by the pair of midrange selectors; and
   an output selector for selecting one of the voltages in the further series of voltages as the analog output voltage when the digital input signal has a value strictly between the first and second boundary values,
   wherein the resistor string comprises
      a first sub-string of first resistors for generating the voltages in the upper range,
      a second sub-string of second resistors for generating the voltages in the midrange, and
      a third sub-string of third resistors for generating the voltages in the lower range,
      wherein the second sub-string being connected in series between the first sub-string and the third sub-string,
      the further series of voltages consists of a number N of voltages, and
      the first resistors and the third resistors have larger resistance values than the resistance values of the second resistors divided by the number N.

2. The digital-to-analog converter of claim 1, wherein the analog output voltages are spaced farther apart when the digital input signal has values equal to or less than the first boundary value, or equal to or greater than the second boundary value, than when the digital input signal has values strictly between the first and second boundary values.

3. The digital-to-analog converter of claim 1, wherein the midrange voltage generator comprises a second resistor string.

4. The digital-to-analog converter of claim 1, wherein each of the lower, upper, and midrange selectors has a binary tree structure.

5. The digital-to-analog converter of claim 1, wherein:
   the lower selector comprises n-channel metal-oxide-semiconductor (NMOS) transistors used as analog switching elements; and
   the upper selector and the midrange selectors comprise p-channel metal-oxide-semiconductor (PMOS) transistors used as analog switching elements.

6. The digital-to-analog converter of claim 1, wherein:
   the lower selector comprises NMOS transistors and PMOS transistors used as transmission gates; and the upper selector and the midrange selectors comprise PMOS transistors used as analog switching elements.

7. The digital-to-analog converter of claim 1, wherein one voltage generated by the first resistor string is selected both by one of the lower selector and the upper selector and by one of the pair of midrange selectors.

8. The digital-to-analog converter of claim 1, wherein the voltages selected by the lower selector, the upper selector, and the output selector are related to the values of the digital input signal by a gray scale correction curve.

9. The digital-to-analog converter of claim 1, wherein each of the digital input signal comprises at least eight bits.

10. The digital-to-analog converter of claim 9, wherein:
each value of the digital input signal comprises n bits, n being a positive integer;
the output selector is controlled by the least significant k bits of the digital input signal, k being a positive integer less than n; and
the further series of voltages comprises equally spaced voltages equal in number to the k-th power of two.

11. The digital-to-analog converter of claim 1, wherein:
each value of the digital input signal comprises n bits, n being a positive integer; and
the number of voltages in the upper range is the m-th power of two, m being a positive integer less than n.

12. The digital-to-analog converter of claim 11, wherein m is equal to n minus five.

13. The digital-to-analog converter of claim 11, wherein the upper selector is controlled by the m least significant bits of the digital input signal and operates when the n minus m most significant bits of the digital input signal are all '1'.

14. The digital-to-analog converter of claim 11, wherein:
the number of voltages in the lower range is the m-th power of two; and
the lower selector is controlled by the m least significant bits of the digital input signal and operates when the n minus m most significant bits of the digital input signal are all '0'.

15. The digital-to-analog converter of claim 11, wherein the further series of voltages comprises equally spaced voltages equal in number to the k-th power of two, k being another positive integer less than n.

16. The digital-to-analog converter of claim 15, wherein k is less than m.

* * * * *